United States Patent [19]
Fletcher

[11] Patent Number: 6,089,894
[45] Date of Patent: Jul. 18, 2000

[54] TEST CONNECTOR

[75] Inventor: David Richard Fletcher, Harlow, United Kingdom

[73] Assignee: 3Com Technologies, Grand Cayman, Cayman Islands

[21] Appl. No.: 09/135,251

[22] Filed: Aug. 17, 1998

[30] Foreign Application Priority Data

May 29, 1998 [GB] United Kingdom .................... 9811639
Jun. 18, 1998 [GB] United Kingdom .................... 9813203

[51] Int. Cl.[7] .................................................. H01R 13/64
[52] U.S. Cl. ............................................................ 439/247
[58] Field of Search .................................... 439/247, 248, 439/34, 68, 310, 372; 174/72, 69; 29/868; 361/600, 601

[56] References Cited

U.S. PATENT DOCUMENTS

| | | | |
|---|---|---|---|
| 3,755,771 | 8/1973 | Brush | 339/64 R |
| 5,531,611 | 7/1996 | Reed et al. | 439/540.1 |
| 5,771,575 | 6/1998 | Onizuka et al. | 29/868 |
| 5,919,055 | 7/1999 | Hattori | 439/310 |
| 5,921,782 | 7/1999 | Yamaguchi et al. | 439/34 |

FOREIGN PATENT DOCUMENTS

| | | | |
|---|---|---|---|
| 0347294 | 12/1989 | European Pat. Off. | B25J 17/02 |
| 1398458 | 6/1975 | United Kingdom | H01R 13/62 |

*Primary Examiner*—Paula Bradley
*Assistant Examiner*—Alexander Gilman
*Attorney, Agent, or Firm*—David J. Weitz; Wilson Sonsini Goodrich & Rosati

[57] ABSTRACT

An automatic insertion connector device, for instance for use in a test environment, particularly for connection to an RJ45 type connector. The connector has a contact portion having the general form of a connector part arranged to match the connector part it is intended to connect to, and is resiliently mounted by way of being carried on resilient material on a carrier means. The resilient mounting permits some deviation from the rest position in relation to the carrier and therefore enables account to be taken of deviation from the expected location of the parts under test.

13 Claims, 2 Drawing Sheets

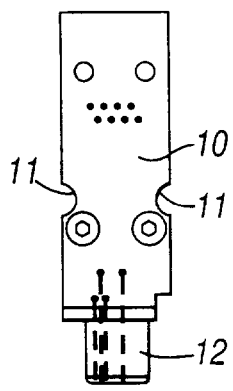 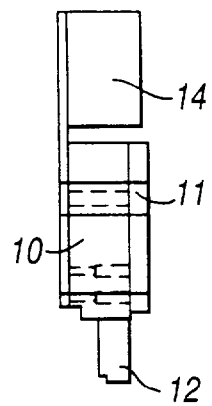 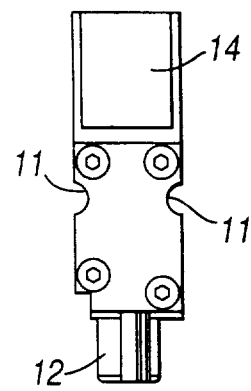
Fig.1a  Fig.1b  Fig.1c
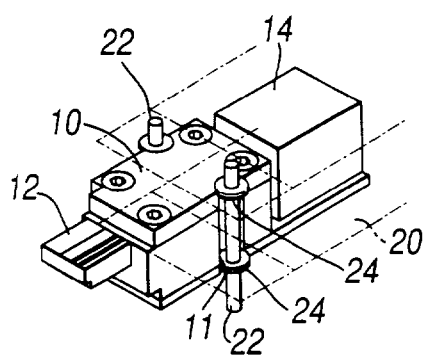
Fig.2

TEST CONNECTOR

BACKGROUND OF THE INVENTION

1. Field of the Invention

The present invention relates to an electrical connection device particularly for use in a production test environment.

2. The Prior Art

It is common, in the manufacture of electronic equipment, to include test procedures on the manufactured articles to ensure that they function correctly. Typically, a production item of electronic equipment, such as a device for use in a computer network, comprises one or more printed circuit boards carrying the components and circuitry necessary for the device to perform its desired function, an enclosure in which the circuit boards are positioned and a plurality of external connectors enabling connection to be made with the circuitry within the device enabling the device to function. Typically test procedures include making electrical contact with the external connectors to enable the application of electrical signals to the circuitry within the device and to record the response.

The present invention is concerned simply with the making of this electrical contact during the test procedure and the actual test procedures which are conducted do not form part of this invention.

One type of electrical connector which is well known to be used for signal inputs and outputs to electronic devices such as devices for use in a computer network, are RJ45 connectors. These particular connectors are push fit connectors which provide an eight terminal connection (although not all of the eight terminals need be used in any application) and are used for connecting cables carrying data signals. In a standard 10-base 2 Ethernet network, it is necessary to connect two twisted pairs of data wires within the cable, and so four of the eight above mentioned connections are used. In other applications, all of the connections may be used either as loop-back or direct connections.

A standard RJ45 connector also has a mechanical interlock between the male part of the of the connector and the female part, which is formed of a resilient member which forms a latch on insertion of the male part into the female part, and which must be deflected by user in order to break the connection. This therefore provides a mechanically secure connection, and the RJ45 connector is a widely used device. Other similar connectors are also known which operate on essentially the same mechanical principles, but are not formed as RJ45 connectors. For instance, similar plug and socket arrangements having a mechanical interlock, are widely used for the connection of telephone terminal apparatus both in domestic and private exchange situations.

In a test environment where it is desired rapidly to make and break electrical connections to devices in order to enable as many devices as possible to be processed, the use of "proper" male RJ45 connectors to connect to the female connectors on the device under test has disadvantages. In particular, the mechanical interlock complicates automated operation. The interlock system is, as mentioned above, designed for manual operation and may therefore be not simple to automate, and in any event it would increase the test cycle time if it were necessary to make and break the mechanical interlock for each socket under test. Further, standard RJ45 connectors and other similar style connectors may not be constructed to be sufficiently durable to be acceptable in a test environment before they fail.

An additional problem is that, although specified to be in a particular location on the exterior of electronic devices, the female connectors are subject to some variation in their exact position. Typically, the connectors are mounted on a PCB which in turn is mounted within the enclosure of the device such that they are presented to the exterior. These mountings are subject to some variation which may be reflected in variation in the position or angle of the connectors as they are presented to the exterior.

In the test environment, the device under test is held in a specified location and an automated or robotic piece of machinery automatically inserts connectors into the connectors on the exterior of the device in order to perform the test procedures mentioned above. Although the variation in the exact positions of the connectors may only be of the order of 0.5 mm or less, this may be sufficient to cause difficulties with the insertion of rigidly mounted connectors by the automated machinery. These difficulties may be increased wear to the test connectors, or actual damage to the connectors on the device under test, or even it may be impossible to insert the connector at all in so that it becomes impossible to conduct the desired testing.

SUMMARY OF THE INVENTION

The present invention provides an electrical connection device for making electrical contact with a push-fit connector part which has a plurality of first electrical contacts and which is mounted at the exterior of an electrical device, the electrical connection device comprising a body member, at least a portion of the body member being adapted for making mechanical contact with said push-fit connector part and carrying a plurality of second electrical contacts arranged to make electrical contact with said first electrical contacts;

a carrier member; and resilient mounting means arranged to mount said body member on said carrier member in a determined position but allowing some lateral or angular deviation from said position.

In use the carrier member moves the body member such that said body member moves toward a push-fit connector part with which it is desired to make contact, and the resilient mounting means enables connection to be made with that connector part even if its angular or lateral position departs from that which is expected. This is particularly useful in the test environment where, as outlined above, the exact position of the connectors at the exterior of an electrical device under test cannot be exactly predetermined even when the positional relationship between the external enclosure of the device and the carrier member, which forms part of the test equipment, is fixed.

In the preferred embodiment the resilient mounting means comprises two grooves formed on said body member and two pins each having resilient material around at least a portion of its length forming part of said carrier member, the body member being mounted on said carrier member by way of said resilient material and pins being positioned in said grooves respectively.

This particular arrangement provides a simple mounting which allows some lateral deviation from a centre position both vertically and horizontally, and also allows some angular deviation from the rest position.

In the preferred embodiment the grooves are of substantially arcuate cross-section. Also it is preferred that the resilient material is provided in the form of at least one O-ring.

In the simplest arrangement the connection device of this invention is formed so as to be able to make connection with a single connector part on a device. One or more such devices may be used, possibly mounted on a common carrier means, in an item of test equipment, for connection with a corresponding number of connector parts on a device under test.

In other embodiments however a plurality of portions of the body member of a single connection device are formed to connect respectively with a plurality of connector parts on a device under test. The body member rigidly fixes the relationships between the plurality of portions and the body member as a whole is resiliently mounted as described above. This arrangement is useful in circumstances where the plurality of connector parts at the exterior of the device under test are formed as parts of a single moulding, which is mounted on a PCB within the device. In this case, the physical relationship between the connector parts is accurately predetermined because they are formed in a single moulding. However, the moulding as a whole may be inaccurately mounted, and so, correspondingly, the test connectors as a whole are resiliently mounted to account for this.

For the sake of clarity, it should be noted that the term push-fit connector used herein designates any connector device in which electrical connection is made by pushing the two parts of the connector together. The term thus includes connectors of the RJ45 type, as well as other connectors in which electrical connection is made by way of a longitudinal insertion of one part into another. While in the embodiment described below, the connector part with which connection is being made is a standard female type part and the connection device stands in for the male part of the connector, the invention is equally applicable to connection arrangements where this situation is reversed.

BRIEF DESCRIPTION OF THE DRAWINGS

This invention will be better understood from the following description of preferred embodiments given by way of example and with reference to the accompanying drawings, in which:

FIG. 1 illustrates top, side and bottom views of a connector according to the first preferred embodiment of the invention;

FIG. 2 is a schematic perspective diagram showing the mounting of the connector of FIG. 1 in a carrier means which forms part of a test apparatus.

DETAILED DESCRIPTION OF THE DRAWINGS

Figure 3A:
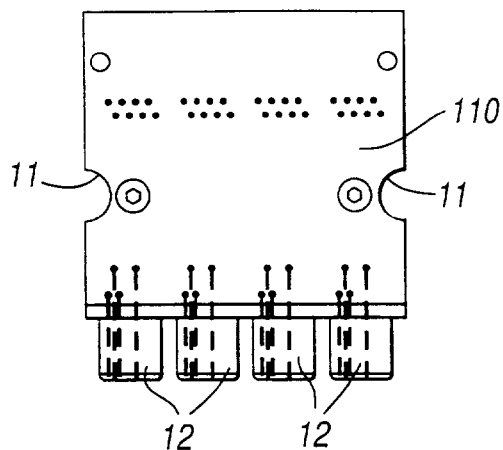
FIG. 3 illustrates top, side and bottom views of a connector according to an alternative embodiment of the invention.

In general terms there is described in the following an automatic insertion connector device, for instance for use in a test environment, particularly for connection to an RJ45 type connector. The connector has a contact portion having the general form of a connector part arranged to match the connector part it is intended to connect to, and is resiliently mounted by way of being carried on resilient material on a carrier means. The resilient mounting permits some deviation from the rest position in relation to the carrier and therefore enables account to be taken of deviation from the expected location of the parts under test.

FIG. 1 illustrates top, side and bottom views of a connector according to the first preferred embodiment of the invention. The connector device 10 in FIG. 1 has a projection 12 which is formed to have basically the same form as the male part of a standard RJ45 connector. That is to say it has a plurality of electrical contacts (shown in dotted outline) formed on it and it is of an appropriate size and shape to fit into the female part of a standard RJ45 connector such that the electrical contacts make contact with the contact portions in the female part. The resilient latch member which forms part of the standard male RJ45 connection part is omitted, as it is not necessary in the test environment to form a mechanical latch and, as outlined above, it would be disadvantageous to do so.

At the other end of connector 10 from projection 12 is provided a connection means 14. In the illustrated embodiment this a standard female RJ45 connector, the conductors of which are connected, via conductors in connector 10, to the electrical contacts on projection 12. This enables connection to be made to the electrical contacts on projection 12 by simply inserting a standard lead with an RJ45 connector at the end into connection means 14.

In the sides of connector 10 there are formed two grooves 11 having a substantially semi-circular cross-section. These are formed to permit the mounting of the connection device 10 in a test apparatus, as described in the following in relation to FIG. 2.

FIG. 2 is a schematic perspective diagram showing the mounting of the connector of FIG. 1 in a carrier means which forms part of a test apparatus.

The carrier means is shown representatively in dotted outline in FIG. 2, and its actual form is not important, save that it provides rigid mounting of pins 22. As shown, pins 22 are positioned so as to be located respectively in grooves 11 of connector 10. The diameters of pins 22 are however smaller than the diameters of the grooves 11, and the space thus left between the pins 22 and the surface within grooves 11 is taken up by O-rings 24 made of rubber or other resilient or elastic material.

By way of such resilient mounting of the connector 10, the connector 10 is able to deflect laterally in three dimensions as well as rotationally in three dimensions with respect to the carrier 20. This enables connection to be made to a female RJ45 part the position of which is slightly variant from what is expected. The surfaces of the 0-rings and the grooves and pins do slide in relation to each other. Rather the variation is permitted by the resilience of the material forming the 0-rings. This also means that on release from one connector, the connection device 10 returns to a rest position ready for insertion into another connector which may require deflection in a different direction.

By way of example, a connection means as illustrated in FIGS.1 and 2 may be constructed such that the grooves 11 have a diameter of 6 mm, while the pins 22 have a diameter of 5 mm, with the space being taken up by an O-ring as described above. In such an arrangement a possible deflection of approximately 0.5 mm is available in any direction, which is sufficient to cope with the variations in position found in PCB mounted single RJ45 connectors in electrical devices.

Figure 3B:
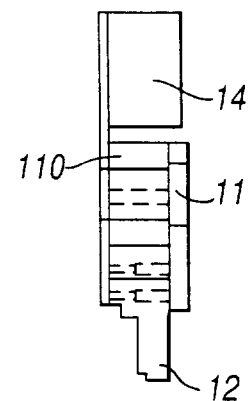
Figure 3C:
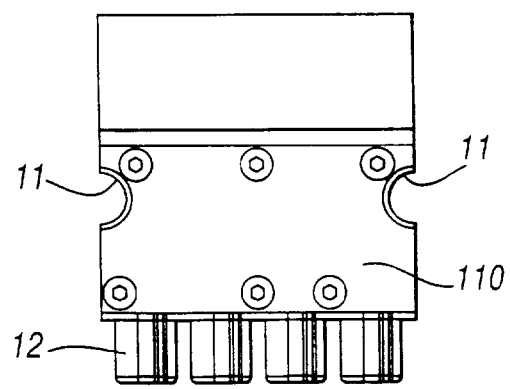

FIG. 3 illustrates top, side and bottom views of a connector 10 similar to connector 10 except that a plurality of projections 12, four in the case shown, are provided. These projections are each similar to projection 12 in FIG. 1 and enable simultaneous connection to be made to a corresponding plurality of female RJ45 connector parts on an electrical device. The connector 10 has grooves 11 for mounting by way of pins 22 and O-rings 24 in the same manner as shown in FIG. 2. In the case of a multiple connector as shown in FIG. 3 it may be preferable to permit a greater deflection from the rest position, and, by way of example, this has been achieved by forming the grooves 11 with a diameter of 12 mm and the pins 22 with a diameter of 8 mm. This permits a deflection of approximately 1 mm in any direction.

Connectors formed according to the preferred embodiments of the present invention are advantageous for use in a test environment. The deflection allowed by the resilient mounting not only increases the likelihood that a proper connection with the device under test will be made, but also reduces the physical wear and tear on the device. This means that the device remains usable for at least 150,000 insertion cycles, as compared to approximately 1,000 for a standard RJ45 connector mounted as a test connector.

What is claimed is:

1. An electrical connection device for making electrical contact with a push-fit connector part which has a plurality of first electrical contacts and which is mounted at the exterior of an electrical device, the electrical connection device comprising:

a body member, at least a portion of the body member being adapted for making mechanical contact with said push-fit connector part and carrying a plurality of second electrical contacts arranged to make electrical contact with said first electrical contacts;

a carrier member; and mounting means arranged to mount said body member on said carrier member in a determined position but allowing some lateral or angular deviation from said position the mounting means comprising two grooves formed on side walls of said body member in direction perpendicular to a direction which the connection device meets with said push-fit connector and two pins forming part of said carrier member; wherein the body member; being mounted on said carrier member by way of said two pins being positioned in said grooves respectively.

2. An electrical connection device according to claim 1 in which said grooves are of substantially arcuate cross-section.

3. An electrical connection device according to claim 1 in which a plurality of portions of the body member are formed each being adapted to make contact with a said push-fit connector part.

4. An electrical connection device according to claim 1 comprising a plurality of said body members and a corresponding plurality of said mounting means arranged to mount said body members on said carrier means.

5. An electrical connection device according to claim 1 in which said portion of said body member is adapted to make contact with a female part of a connection device.

6. An electrical connection device according to claim 1 in which said portion of said body member is adapted to make contact with one part of a connection device of the RJ45 type.

7. An electrical connection device for making electrical contact with a push-fit connector part which has a plurality of first electrical contacts and which is mounted at the exterior of an electrical device, the electrical connection device comprising:

a body member, at least a portion of the body member being adapted for making mechanical contact with said push-fit connector part and carrying a plurality of second electrical contacts arranged to make electrical contact with said first electrical contacts;

a carrier member; and resilient mounting means arranged to mount said body member on said carrier member in a determined position but allowing some lateral or angular deviation from said position, the mounting means comprising two grooves formed on said body member and two pins each having resilient material around at least a portion of its length forming part of said carrier member, the body member being mounted on said carrier member by way of said two pins, with resilient material, being positioned in said grooves respectively.

8. An electrical connection device according to claim 7 in which said grooves are of substantially arcuate cross-section.

9. An electrical connection device according to claim 7 in which said resilient material is provided in the form of at least one O-ring.

10. An electrical connection device according to claim 7 in which a plurality of portions of the body member are formed each being adapted to make contact with a said push-fit connector part.

11. An electrical connection device according to claim 7 comprising a plurality of said body members and a corresponding plurality of said resilient mounting means arranged to mount said body members on said carrier means.

12. An electrical connection device according to claim 7 in which said portion of said body member is adapted to make contact with a female part of a connection device.

13. An electrical connection device according to claim 7 in which said portion of said body member is adapted to make contact with one part of a connection device of the RJ45 type.

* * * * *